(12) United States Patent
Liu et al.

(10) Patent No.: US 11,329,164 B2
(45) Date of Patent: May 10, 2022

(54) METAL-OXIDE-SEMICONDUCTOR FIELD-EFFECT TRANSISTOR WITH A COLD SOURCE

(71) Applicants: VERSITECH LIMITED, Hong Kong (HK); THE ROYAL INSTITUTION FOR THE ADVANCEMENT OF LEARNING/ MCGILL UNIVERSITY, Montreal (CA)

(72) Inventors: Fei Liu, Hong Kong (HK); Jian Wang, Hong Kong (HK); Hong Guo, Montreal (CA)

(73) Assignees: THE UNIVERSITY OF HONG KONG, Hong Kong (HK); THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 0 days.

(21) Appl. No.: 17/056,036

(22) PCT Filed: Jun. 6, 2019

(86) PCT No.: PCT/CN2019/090411
§ 371 (c)(1),
(2) Date: Nov. 17, 2020

(87) PCT Pub. No.: WO2019/233481
PCT Pub. Date: Dec. 12, 2019

(65) Prior Publication Data
US 2021/0210639 A1    Jul. 8, 2021

Related U.S. Application Data

(60) Provisional application No. 62/701,386, filed on Jul. 20, 2018, provisional application No. 62/681,580, filed on Jun. 6, 2018.

(51) Int. Cl.
*H01L 29/786* (2006.01)
*H01L 29/66* (2006.01)

(52) U.S. Cl.
CPC .. *H01L 29/78618* (2013.01); *H01L 29/66742* (2013.01); *H01L 29/66977* (2013.01); *H01L 29/78696* (2013.01)

(58) Field of Classification Search
CPC ......... H01L 29/78618; H01L 29/66742; H01L 29/66977; H01L 29/78696; H01L 29/0834;
(Continued)

(56) References Cited

U.S. PATENT DOCUMENTS 6,440,808 B1   8/2002   Boyd et al.
8,815,722 B2   8/2014   Fung et al.
(Continued)

OTHER PUBLICATIONS

International Search Report and Written Opinion for International Application No. PCT/CN2019/090411 dated Aug. 30, 2019, 9 pages.

*Primary Examiner* — Tong-Ho Kim
(74) *Attorney, Agent, or Firm* — Amin, Turocy & Watson, LLP

(57) ABSTRACT

A metal-oxide-semiconductor field-effect transistor (MOSFET) device is provided. The device comprising: a substrate; an oxide layer on the substrate; a gate on the oxide layer; a source and a drain on the substrate, wherein the source and the drain are doped with a dopant of a first type; and a cold source coupled to the source, wherein the cold source comprises a junction between a semiconductor doped with a dopant of a second type, and a material selected from the group consisting of metal and semimetal.

23 Claims, 14 Drawing Sheets

(58) Field of Classification Search
CPC ............... H01L 29/0847; H01L 29/458; H01L 29/78648; H01L 29/78654; H01L 29/7391; H01L 29/785
USPC ........................................................ 257/105
See application file for complete search history.

(56) References Cited

U.S. PATENT DOCUMENTS

2002/0060346 A1\* 5/2002 Cheng ............... H01L 29/66507
257/382
2013/0295732 A1 11/2013 Wu et al.

\* cited by examiner

METAL-OXIDE-SEMICONDUCTOR FIELD-EFFECT TRANSISTOR WITH A COLD SOURCE

TECHNICAL FIELD

The technology discussed below relates generally to a metal-oxide-semiconductor field-effect transistor (MOSFET) circuit, and more particularly, to a MOSFET circuit having a low subthreshold swing.

BACKGROUND OF THE INVENTION

The down-scaling of metal-oxide-semiconductor field-effect transistors (MOSFETs) following Moore's law has enabled the continuous growth of information technology for the past decades. By reducing channel length of transistors, switching speed becomes faster, device density becomes higher, and circuits are more powerful and efficient. However, the exponential increase of electronics performance could not continue forever as predicted by Moore's law. Among the issues facing today's transistor technology, the problem of power consumption stands out due to the scaling limit of the supply voltage. For example, the device principle of MOSFETs dictates a subthreshold swing (SS) limit to be 60 mV/decade at room temperature. It is a physical limit of existing MOSFET designs regardless of the channel material and/or device structure. This physical limitation prevents further reduction of the supply voltage and power dissipation of MOSFET devices.

Ongoing research toward a new current switch beyond MOSFET such as tunneling FETs (TFETs) and negative capacitance FETs (NC-FETs) indicates the need of finding a device principle that enables a transistor to be turned on and off without the 60 mV/decade SS limit, while having a large on-current like that of MOSFET. Recently, by exploiting the density of states (DOS) at the transistor source, sub-60 mV/decade switching was experimentally realized and theoretically investigated where Dirac-like electrons were injected at the source of a FET. Moreover, high on-state current orders of magnitude higher than the best TFET of today and sub-60 mV/decade switching may be achieved by injecting electrons from graphene to carbon nanotube.

BRIEF SUMMARY OF THE INVENTION

The present application proposes a novel field-effect transistor (FET) with a cold source (CS) by introducing a metal/semimetal between p-type and n-type semiconductors. By engineering the density of states (DOS) of injected carriers from such a cold source, an efficient energy filtering of high energy electrons is realized and steep-slope switching as small as about 23 mV/decade is achievable in the resulting CS-FETs.

In one aspect, the present application provides a metal-oxide-semiconductor field-effect transistor (MOSFET) device, comprising: a substrate; an oxide layer on the substrate; a gate on the oxide layer; a source and a drain on the substrate, wherein the source and the drain are doped with a dopant of a first type; and a cold source coupled to the source, wherein the cold source comprises a junction between a semiconductor doped with a dopant of a second type, and a material selected from the group consisting of metal and semimetal.

In the other aspect, the present application provides a method of fabricating a metal-oxide-semiconductor field-effect transistor (MOSFET) device, comprising: providing a substrate; providing an oxide layer on the substrate; forming a gate on the oxide layer; forming a source and a drain on the substrate, wherein the source and the drain are doped with a dopant of a first type; and forming a cold source coupled to the source, wherein the cold source comprises a junction between a semiconductor doped with a dopant of a second type, and a material selected from the group consisting of metal and semimetal.

In the other aspect, the present application provides a metal-oxide-semiconductor field-effect transistor (MOSFET) comprising: a source region and a drain region of a first conductivity type; a body region of a second conductivity type opposite to the first conductivity type, between the source region and the drain region; a gate separated by an insulating layer from a channel region of the body region; and a cold source coupled to the source region, wherein the cold source is configured to provide a band gap in the source region to suppress a thermal tail.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. While aspects and embodiments are described in this application by illustration to some examples, those skilled in the art will understand that additional implementations and use cases may come about in many different arrangements and scenarios.

Aspects of the present disclosure provide a novel field-effect transistor (FET) with a cold source (CS) by introducing a metal/semimetal between p-type and n-type semiconductors (e.g., Si). By engineering the density of states (DOS) of injected carriers from such a cold source, an efficient energy filtering of high energy electrons is realized and steep-slope switching as small as about 23 mV/decade is achievable in the resulting CS-FETs. In some examples, a high on-current ($I_{on}$) as large as $7.4 \times 10^2$ µA/µm, can be achieved at a drain voltage ($V_D$)=0.5 V. CS-FETs of the present disclosure have more desirable device performance for low power applications than FETs and tunneling FETs (TFETs). In some examples, the cold source may be realized in various FET structures, for example, FinFETs and Fully Depleted Silicon On Insulator (FD-SOI) FETs.

Figure 1A:
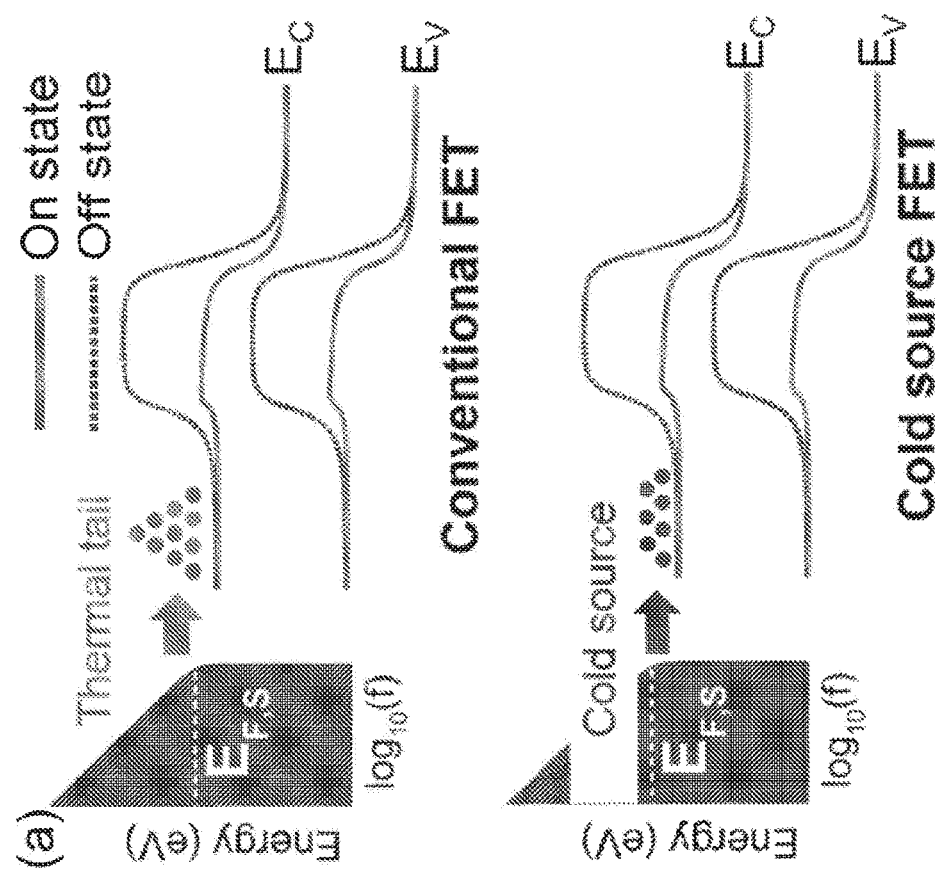
FIG. 1a is a drawing comparing the operational mechanism of conventional FET and cold source FET (CS-FET) according to one aspect of the present disclosure.

In a conventional n-type FET, carriers are injected from a metal contact to n-type semiconductor in the source, as shown in the top part of FIG. 1a. Due to the Fermi distribution of thermionic carriers over the barrier, the subthreshold swing (SS) cannot be smaller than 60 mV/decade at room temperature. Different from the conventional FETs, a CS-FET of the present disclosure is designed by introducing a band gap in the source to suppress the thermal tail, as shown in the lower part of FIG. 1a. The cold source is configured to inject "cold" carriers into the FET. The distribution of the "cold" carriers does not energetically extend into the thermalized Fermi tail at off-state because the tail has been cut-off by the band gap above, and then off-state current is greatly decreased. While, thermionic carriers can directly transport from source to drain at on-state as that of conventional FETs. Such "cold" carriers are thus not limited to a 60 mV/decade SS.

Figure 1B:
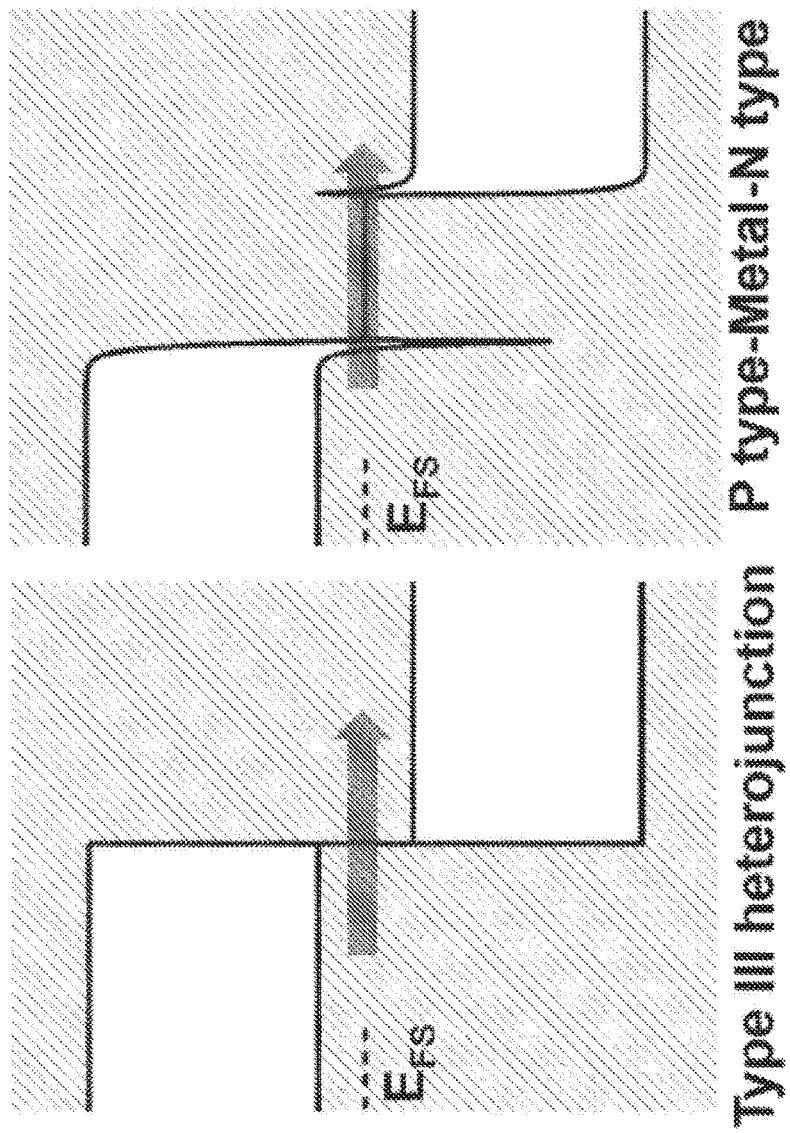
FIG. 1b is a drawing illustrating two types of cold source according to some aspects of the present disclosure.
Figure 1C:
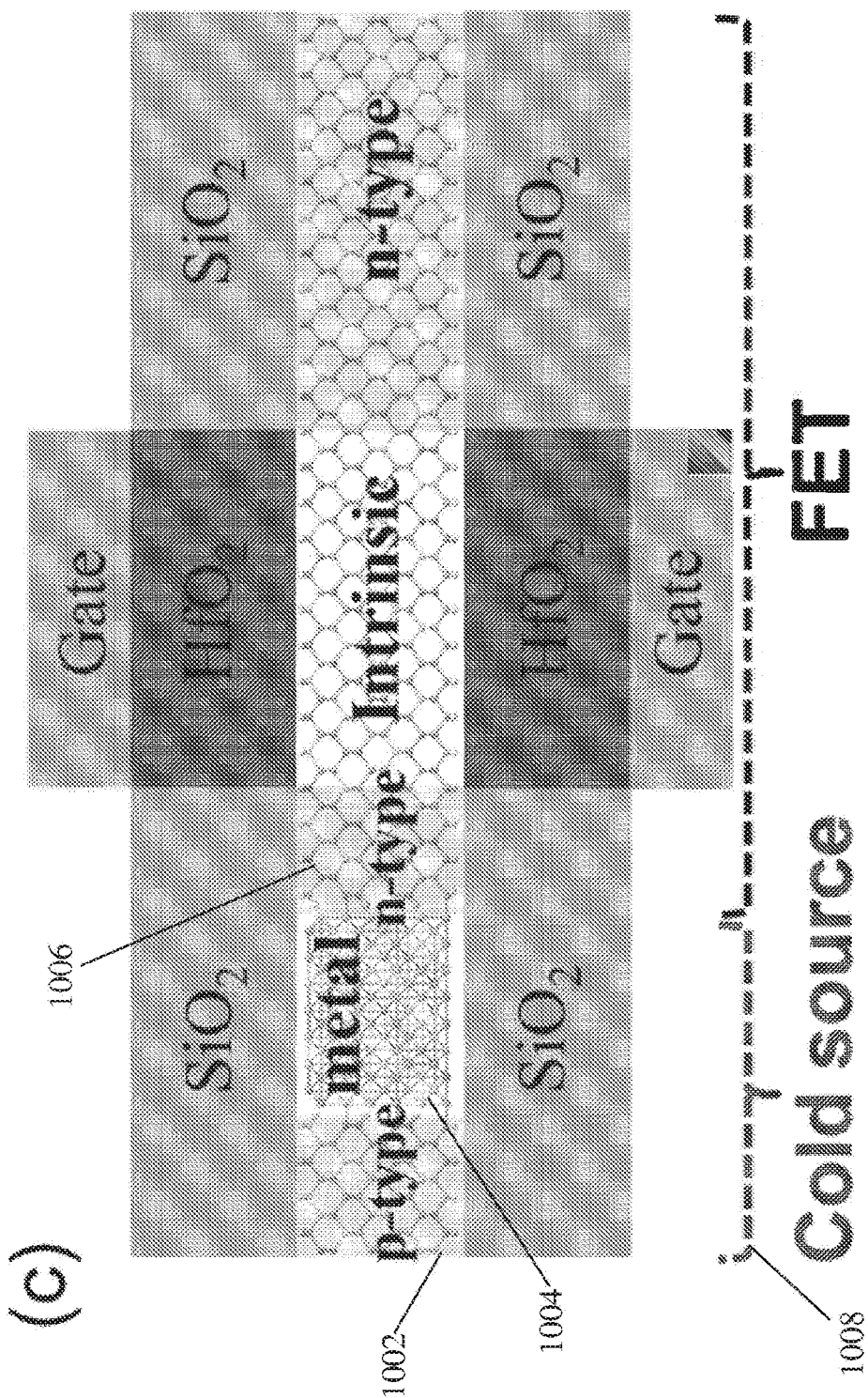
FIG. 1c is a conceptual drawing illustrating a Si cold source FET according to one aspect of the present disclosure.

In some aspects of the disclosure, a cold source may be realized by using a type-III heterojunction or by a junction composed of a p-type semiconductor, a metal/semimetal, and an n-type semiconductor, as schematically shown in FIG. 1b. FIG. 1c conceptually illustrates an exemplary Si CS-FET. In this example, p-type silicon 1002 and a metal 1004 are applied between a metal contact (not shown) and n-type silicon 1006 in the source 1008 of the CS-FET. Therefore, carriers from the metal contact are first injected into the valence band (VB) of the p-type silicon 1002, then through the metal 1004 to the conduction band (CB) of n-type silicon 1006. The CS-FET is thus a combined system of a cold source 1008 with a FET as illustrated in FIG. 1c. The same concept may be applied to a p-type CS-FET. In other embodiments, all suitable metals or semimetals may be used to form the cold source. For example, aluminum, platinum, palladium, cobalt, ruthenium, silver, graphene, and two-dimensional layered metals may be placed between the p-type and n-type semiconductors to form the cold source. In some examples, the two-dimensional layered metals may be 1T phase $MoTe_2$ and $WTe_2$.

Figure 1D:
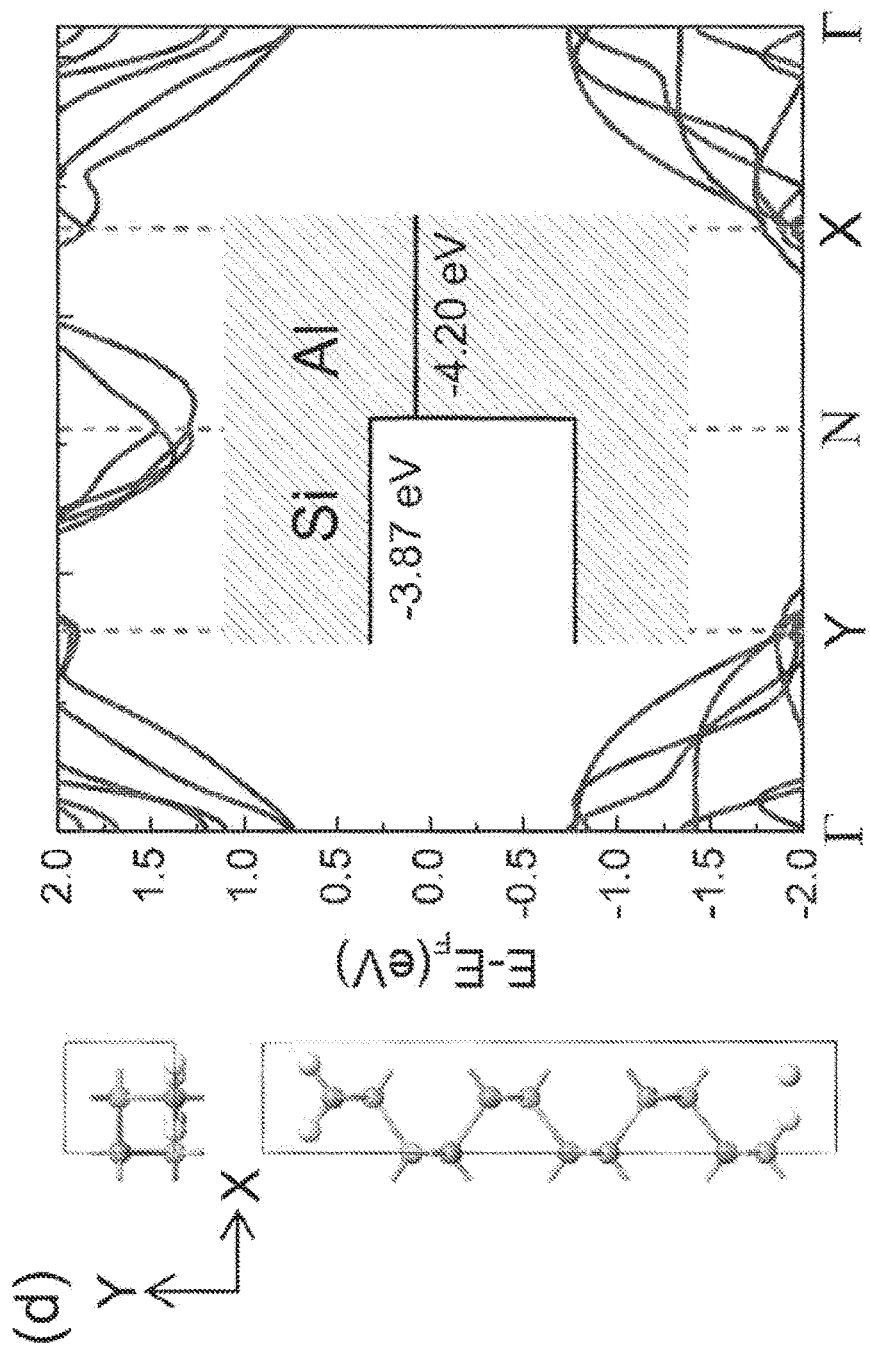
FIG. 1d is a drawing illustrating an atomic structure and band structure of a Si film.

In one example, the electronic structure of a 1.6 nm thick silicon film may be calculated by using the density functional theory (DFT) using the Vienna Ab initio Simulation Package (VASP) or the like. The Heyd-Scuseria-Ernzerhof (HSE) hybrid functional may be used for treating the exchange-correlation, which is known for a better description of band gaps of semiconductors. In one example, a Si film of 1.6 nm thickness with wafer orientation along (100) direction has a direct band gap of 1.48 eV as shown in FIG. 1d. The calculated electron affinity of the Si film is 3.87 eV, and the band offset between Si and aluminum (Al) is 0.33 eV as schematically shown in the inset of FIG. 1d. The valence band maximum (VBM) is anisotropic and has lighter hole effective mass along the Y direction illustrated in FIG. 1d.

Figure 2A:
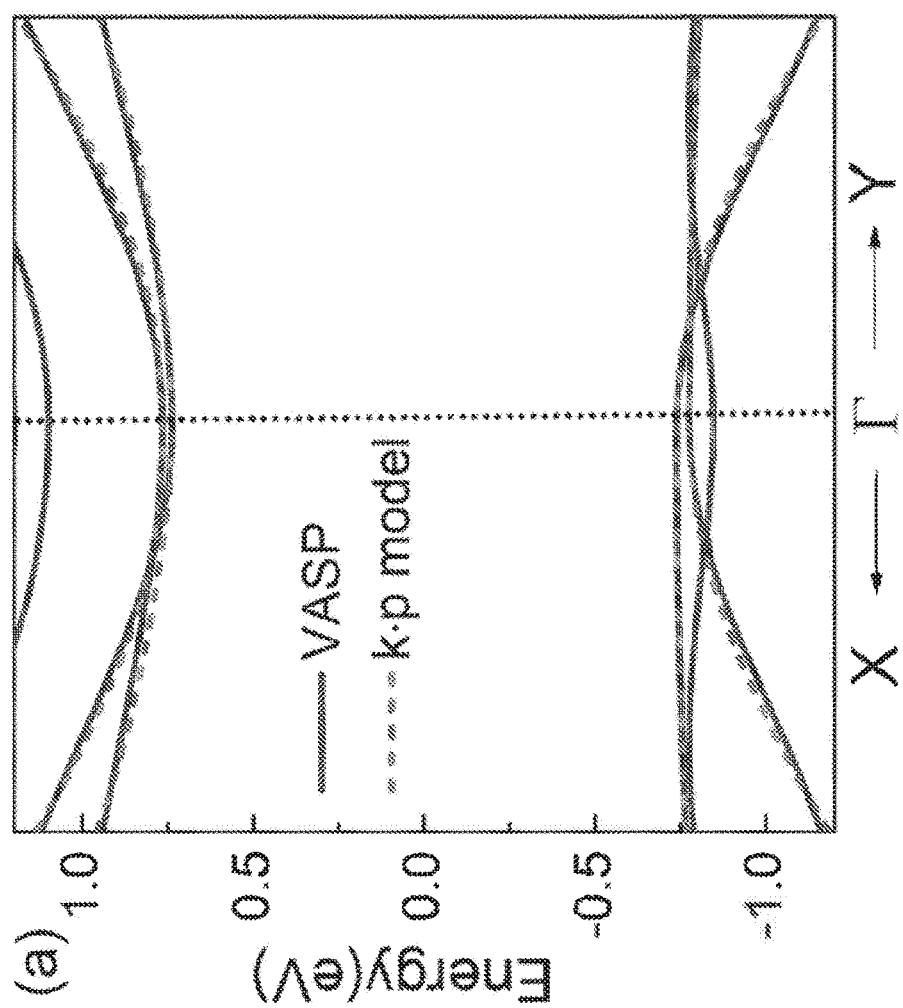
FIG. 2a is a drawing illustrating various band structures according to some aspects of the present disclosure.

In one example, to simplify device simulation, a four-band k p Hamiltonian may be constructed from DFT results. FIG. 2a shows that the four low energy bands are well described by the k p Hamiltonian. The metal (e.g., Al) is approximately described by a gapless four-band model. The simulations of transport properties along the Y direction with lighter effective mass may be carried out by self-consistently solving the Poisson equation and Schrödinger equation within the non-equilibrium Green's function (NEGF) formalism.

ILLUSTRATIVE EXAMPLES AND RESULTS

Figure 2B:
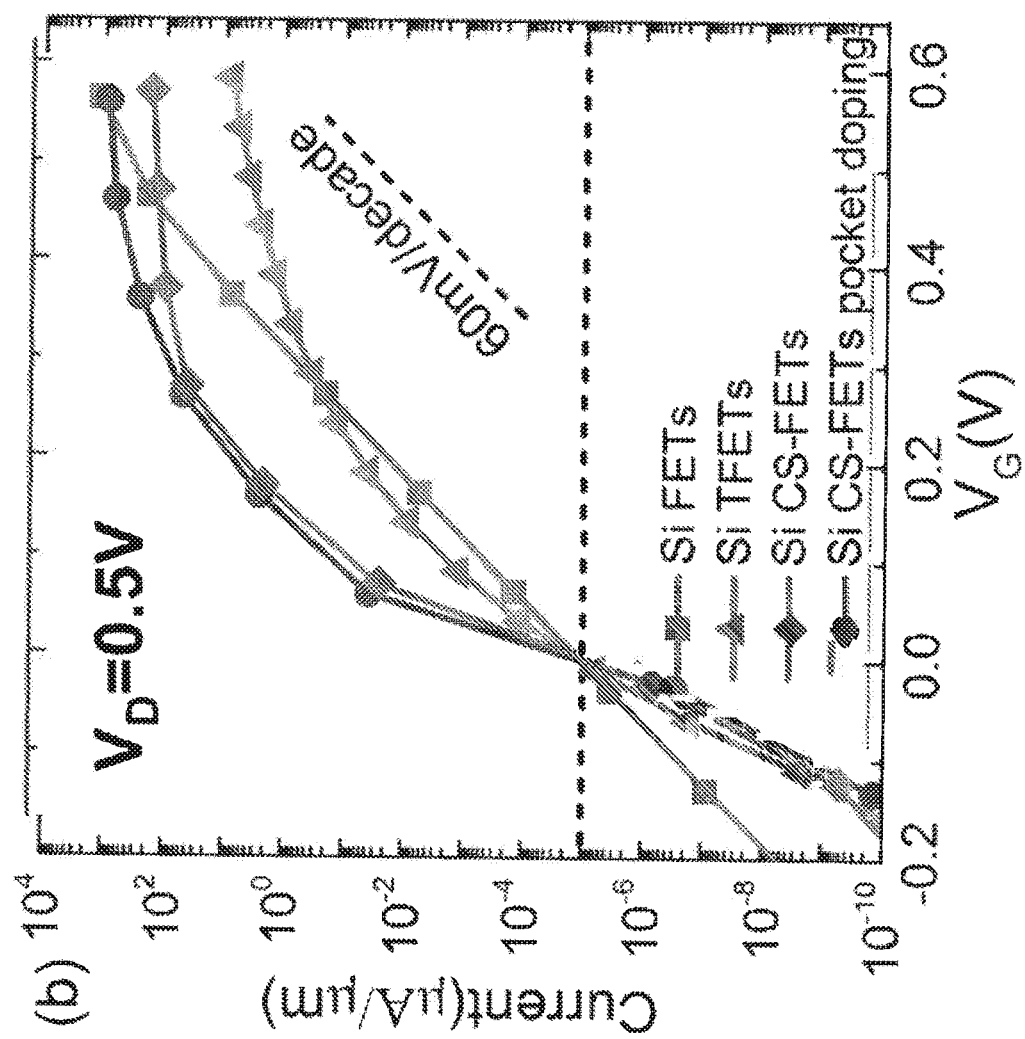
FIG. 2b is a drawing illustrating various current-voltage curves of different transistors according to some aspects of the present disclosure.

The calculated transfer characteristics of Si FETs, TFETs, and CS-FETs with double gates and 3 nm HfO2 oxide layer are compared in FIG. 2b. In these examples, these devices have 15 nm gate length and 20 nm source and drain. For the CS-FETs, 3 nm p-type Si and 3 nm metal (e.g., Al) are applied in the source to form the cold source. Doping concentrations may be modulated by fixing the VBM of p-type Si at $E_{VBM}$=0.2 eV and the conduction band minimum (CBM) of n-type Si at $E_{CBM}$=−0.2 eV: $1.9 \times 10^{19}$ cm$^{-3}$ and $1.9 \times 10^{20}$ cm$^{-3}$ for n-type and p-type Si, respectively. The off-state current of 10 µA/µm according to international technology roadmap for Semiconductors (ITRS) for low power applications is calibrated at gate voltage ($V_G$)=0 V as shown in FIG. 2b. The exemplary Si FETs have good gate control at the subthreshold region, and SS can be as low as 60 mV/decade. The on-state current of Si FETs is $4.8 \times 10^2$ µA/µm, which is still below the requirement of ITRS 2013 for low power application, for example, about $5.6 \times 10^2$ µA/µm at gate length ($L_G$)=15 nm and $V_D$=0.78 V. In comparison, the SS of Si-TFETs can reach 31 mV/decade at around $V_G$=0 V, while the $I_{on}$ at $V_G$=0.5 V is 49 µA/µm, which is smaller than that of Si FETs.

Figure 2C:
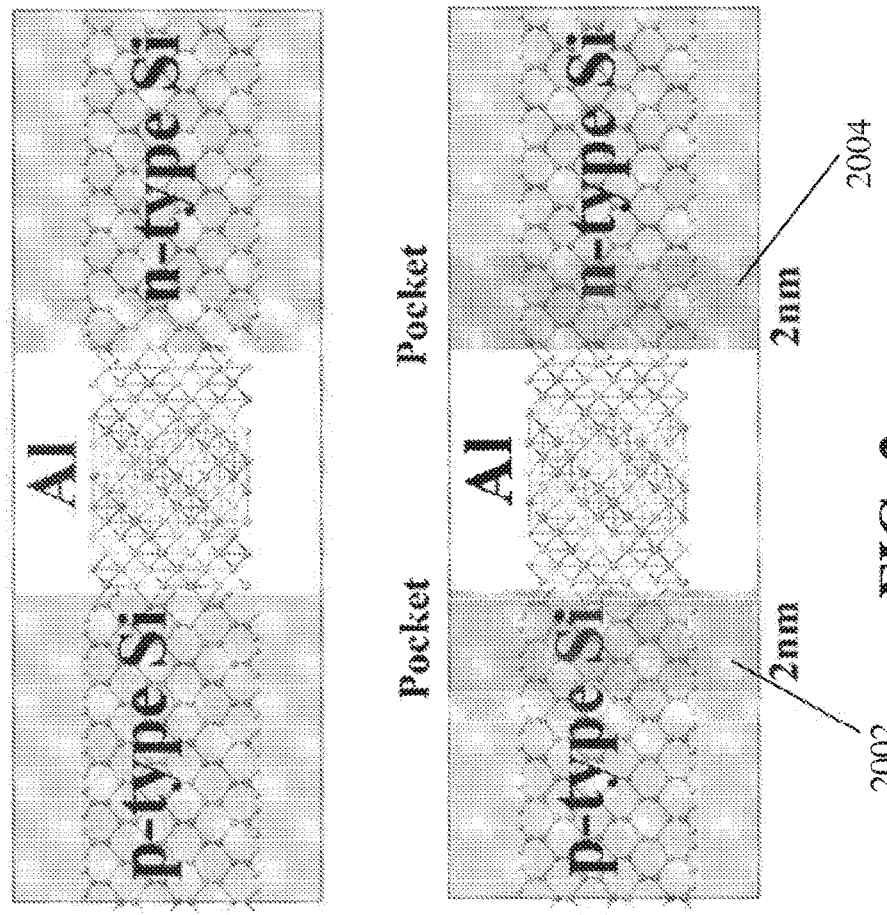
FIG. 2c is a conceptual drawing illustrating the cold source of cold source FETs with and without pocket doping according to some aspects of the present disclosure.
Figure 2D:
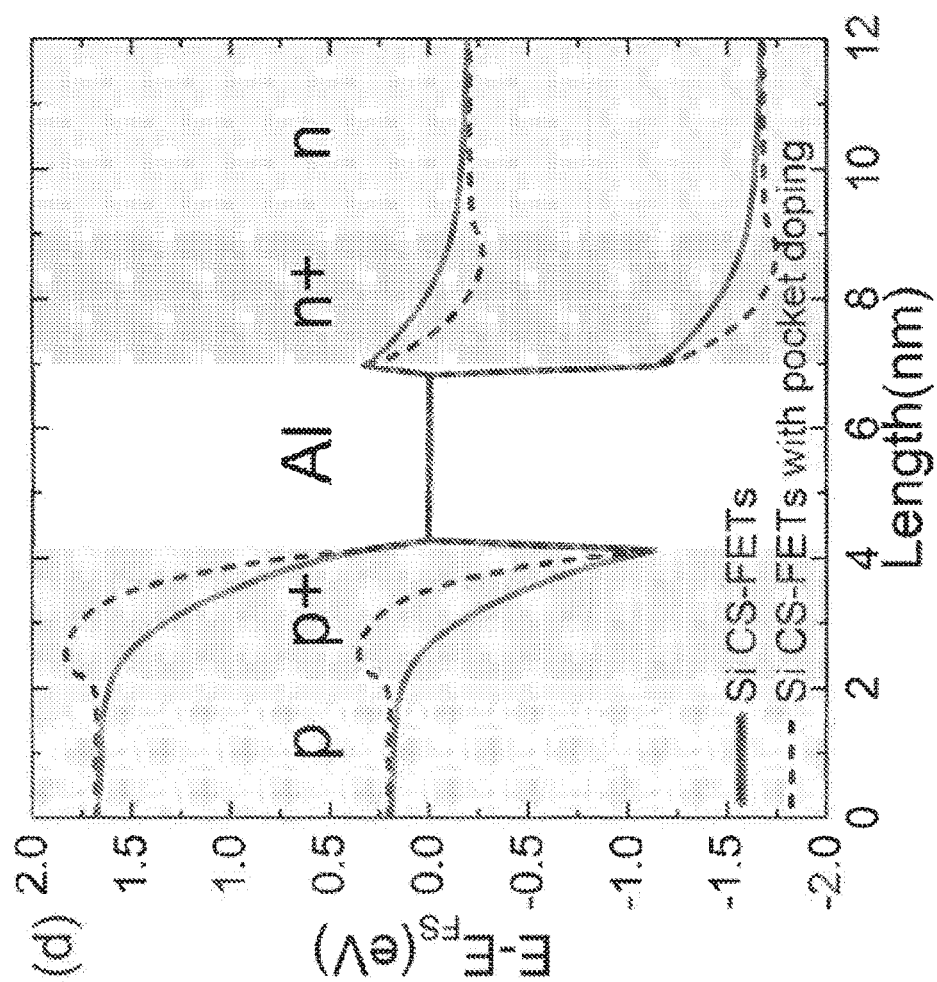
FIG. 2d is a drawing illustrating band edge profiles of cold source FETs according to some aspects of the present disclosure.
Figure 3A:
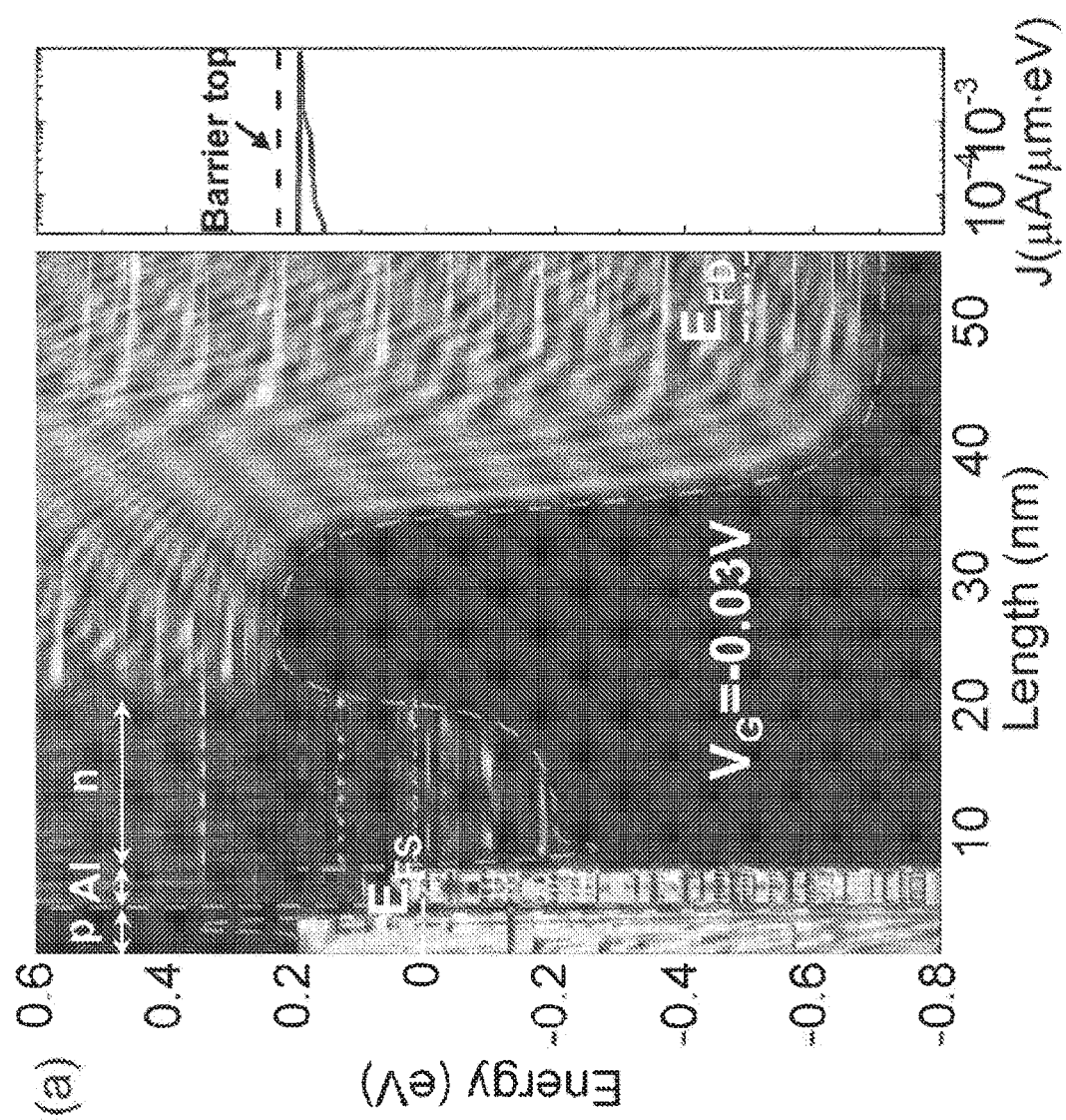
FIG. 3a is a drawing illustrating local density of states along the channel of Si cold source FETs with pocket doping at a first gate voltage.
Figure 3B:
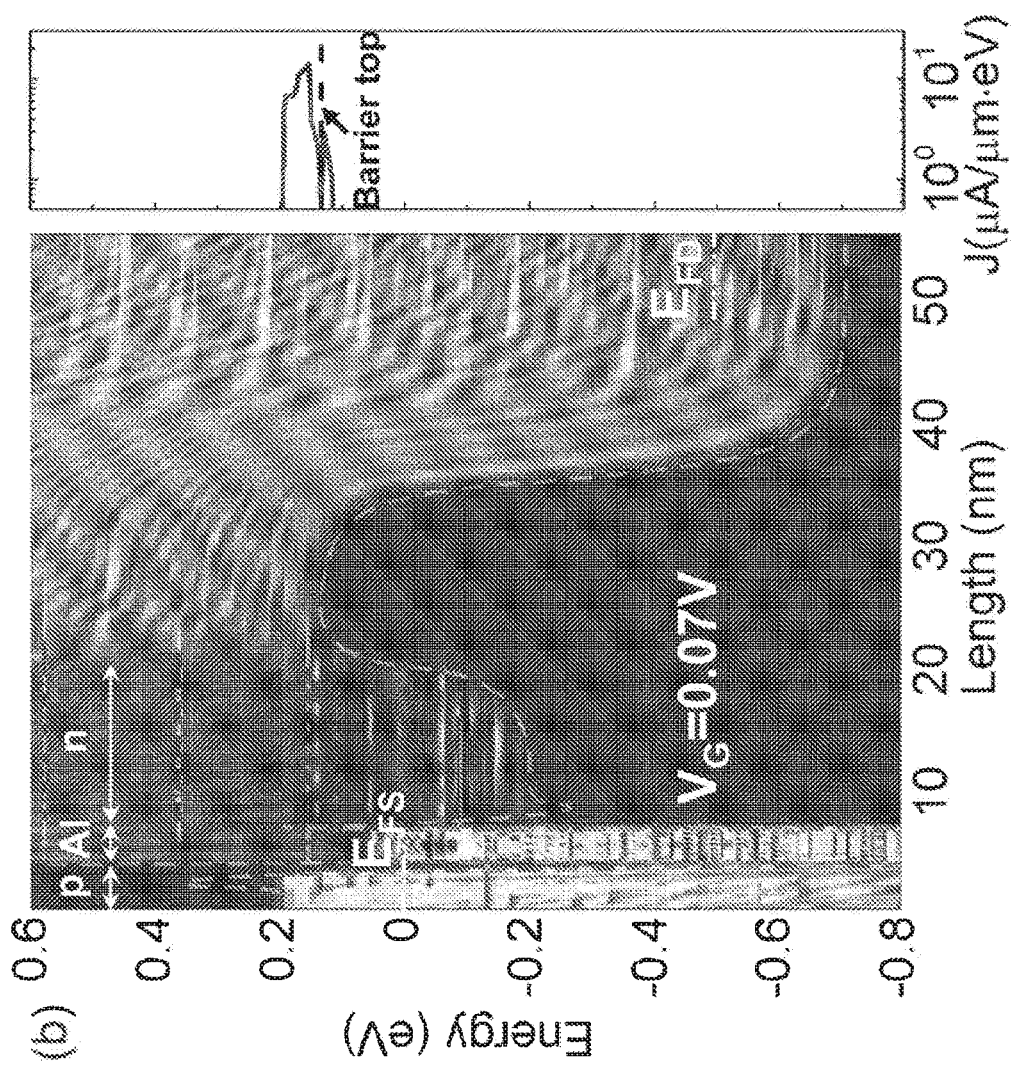
FIG. 3b is a drawing illustrating local density of states along the channel of Si cold source FETs with pocket doping at a second gate voltage.

The Si CS-FETs, on the other hand, has greatly improved switching properties as shown in the examples of FIG. 2b. In one example, the SS is as small as 21 mV/decade at −0.02 V<$V_G$<0.08 V. In one aspect of the disclosure, to improve the on-state current, 2 nm pocket doping (illustrated as regions 2002 and 2004 in FIG. 2c) may be applied in the p-type and n-type Si as conceptually shown in FIG. 2c. In this example, the pocket doping is located near or adjacent to the metal. FIG. 2d shows that the tunneling lengths of Schottky contacts are greatly decreased by using pocket doping. As a result, the $I_{on}$ at $V_G$=0.5 V is increased from $1.4 \times 10^2$ µA/µm to $7.4 \times 10^2$ µA/µm with pocket doping, which is larger than that of Si FETs and 1.3 times larger than the requirement of ITRS 2013. To understand the steep switching, the local density of states (LDOS) of Si CS-FETs with pocket doping at $V_G$=0.02 V and 0.12 V are compared in FIG. 3a and FIG. 3b. It can be found that the top of channel barrier is above the source VBM at $V_G$=−0.03 V. Hence, carriers have to tunnel through the barrier, and the current is composed of the direct tunneling current from source VBs to drain CBs as shown in FIG. 3a. As the gate voltage is increased to 0.07 V, the barrier top moved to lower energy and became smaller than the source VBM. Consequently, the carriers can tunnel through the barrier and also transport over the barrier from source VBs to the drain. The calculated current is found to be mainly contributed by electrons going over the barrier, at about 93%. As the top of barrier is below the source VBM, the working mechanism of CS-FETs in the on-state is the same as that of MOSFETs.

Figure 4A:
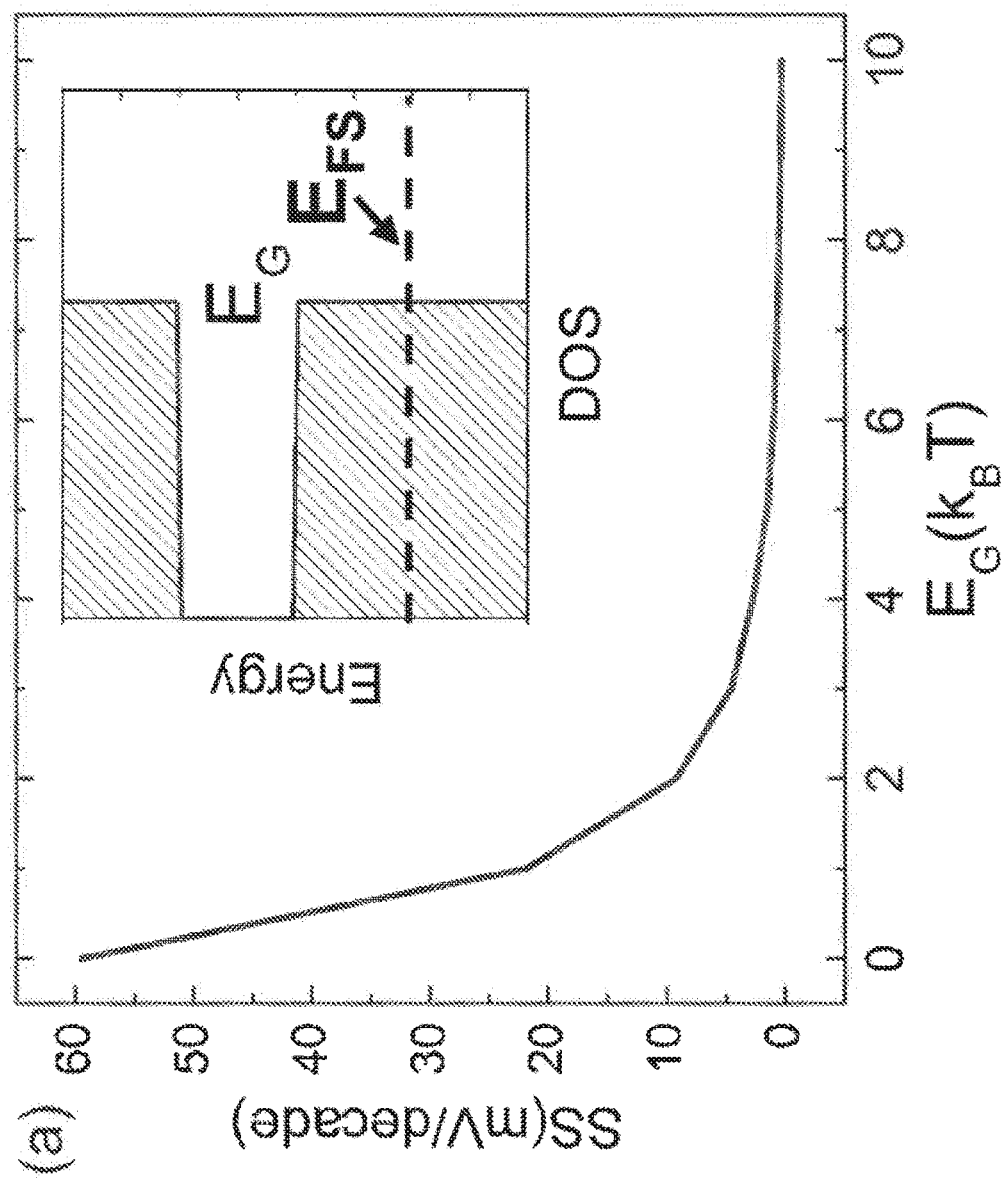
FIG. 4a is a drawing illustrating the subthreshold swing limit of an exemplary cold source FET as a function of source band gap at room temperature.
Figure 4B:
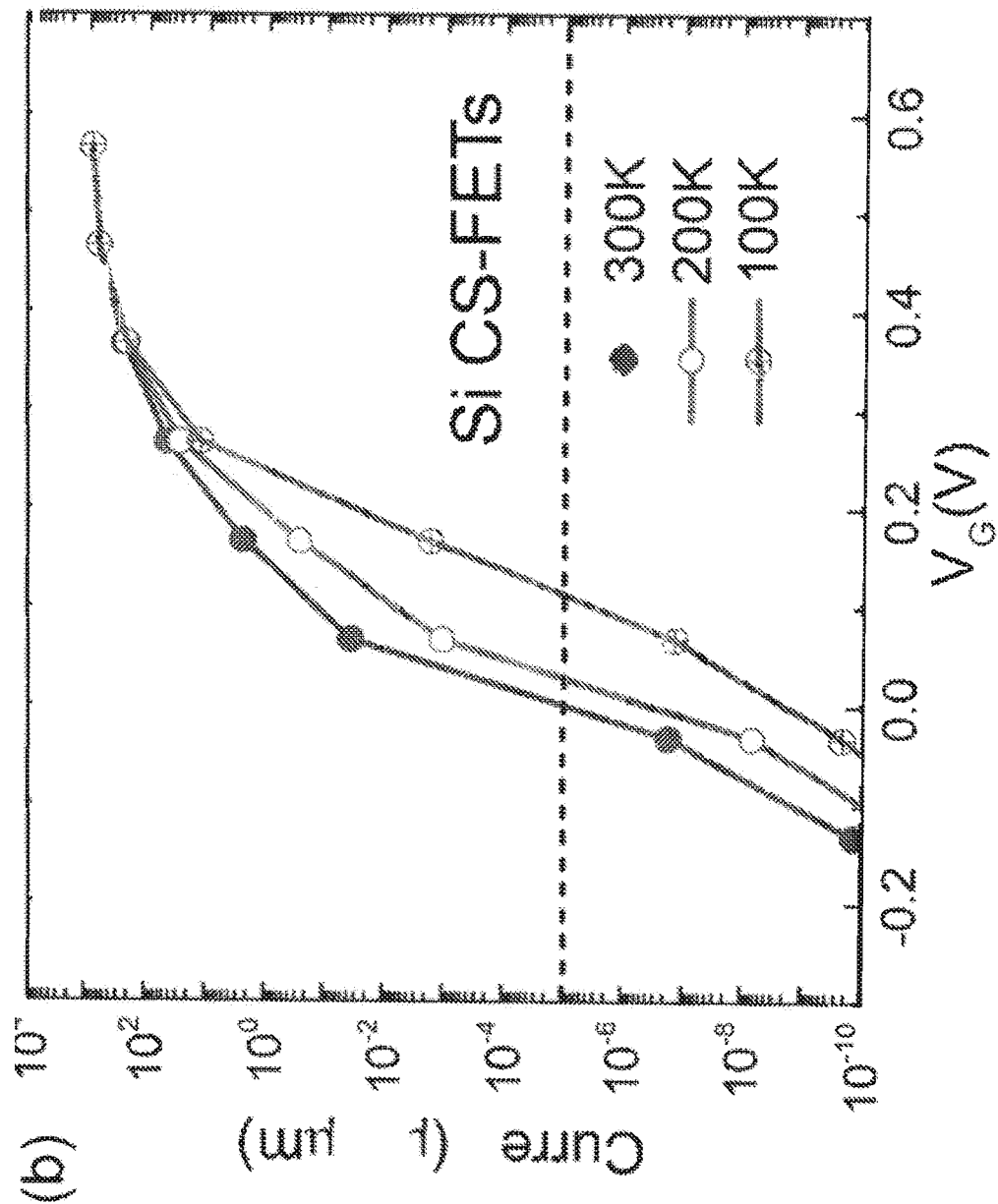
FIG. 4b is a drawing illustrating the temperature effect on the device current as a function of voltage of exemplary cold source FETs.

The current through a transistor may be described by the Landauer-Büttiker formula:

$$I = \frac{2q}{h} \int D(E)T(E)[f_S - f_D]dE, \quad (1)$$

where q is electron charge, h is Plank constant, E is energy, D(E) is the density of states of the transistor source, T(E) is the transmission probability, and $f_{S/D}$ is the Fermi functions of the source/drain. For TFETs, the sub-60 mV/decade switching is achieved by modulating the transmission probability T(E). For CS-FETs, the sub-60 mV/decade switching is realized by introducing a gap in the source. That is, the switching process modulates the alignment between the source VBM and the top of the channel barrier. Tunneling current in the off-state is switched to thermionic current when the top of barrier is below the source VBM. The on-state current is determined by the "cold" source and may be as large as that in MOSFETs after optimizing the injected "cold" carriers. According to Eq. (1) above, with T(E)=1 (i.e., thermionic current over the barrier), the SS limit as a function of the source band gap can be calculated, and it may be as small as 1 mV/decade at band gap $E_G$=6 $k_B$T as shown in FIG. 4(a). The temperature effect on $I_D$-$V_G$ of Si CS-FETs with pocket doping is illustrated in FIG. 4(b). Because sub-60 mV/decade switching of CS-FETs may be realized by modulating thermionic current, the current in the gate voltage region at sub-60 mV/decade switching decreases with temperature.

Figure 4C:
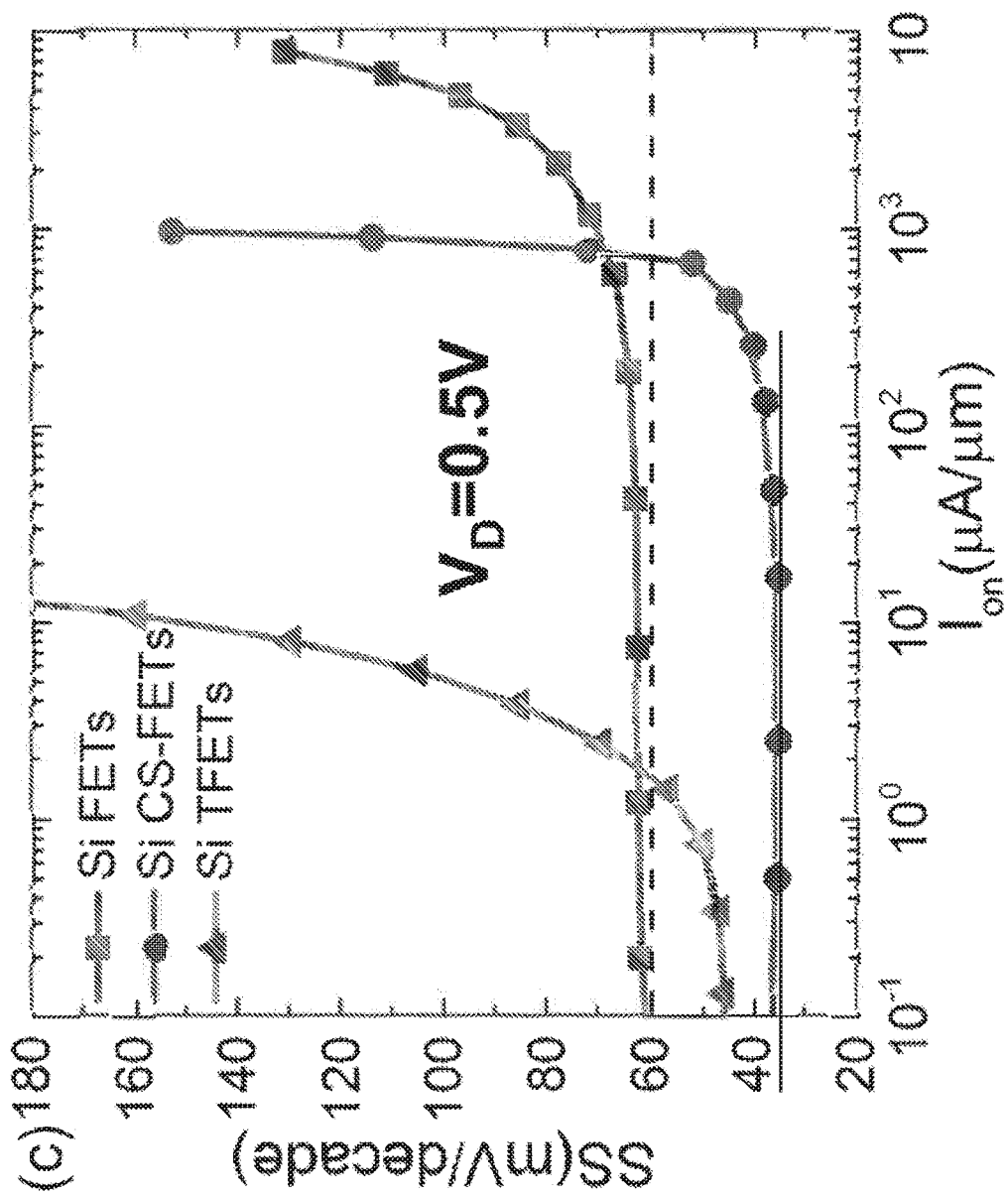
FIG. 4c is a drawing comparing the subthreshold swings of different FETs at a first gate voltage.
Figure 4D:
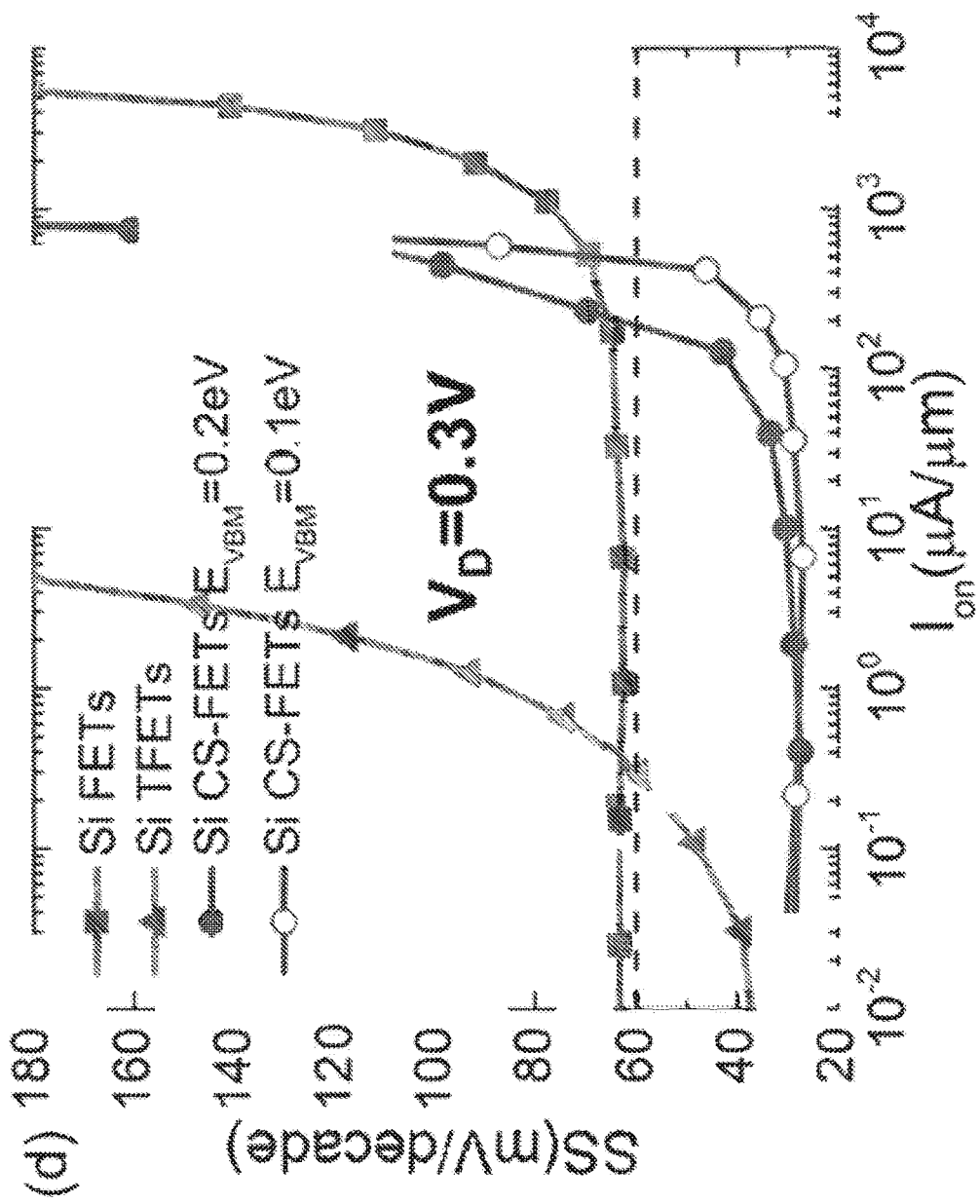
FIG. 4d is a drawing comparing the subthreshold swings of different FETs at a second gate voltage.

FIG. 4c and FIG. 4d compare SS versus $I_{on}$ for three kinds of FETs: Si FETs, CS-FETs with pocket doping, and TFETs. SS and $I_{on}$ may be obtained by charting along the $I_D$-$V_G$ curves with a fixed voltage window of $V_D$. In general, SS degrades (increases) as $I_{on}$ increases. For TFETs, SS can break the 60 mV/decade thermal limit as shown in FIG. 4c, while $I_{on}$ is about 1.7 µA/µm with an average SS of 60 mV/decade. For Si FETs, SS is above 60 mV/decade but larger $I_{on}$ can be obtained. For CS-FETs, FIG. 4c shows that the average SS is as small as 37 mV/decade with $I_{on}$ of 1×10² µA/µm. $I_{on}$ reaches about 7.1×10² µA/µm at SS=60 mV/decade. Referring to FIG. 4d, as $V_D$ is scaled to 0.3 V, $I_{on}$ of CS-FETs at SS=60 mV/decade is about 2.0×102 µA/µm, which may be enhanced to 4.7×10² µA/µm by shifting the p-type Si VBM to $E_{VBM}$=0.1 V using a lower doping concentration as shown in FIG. 4d. At $I_{on}/I_{off}$ ratio over 10⁷, $I_{on}$ of 3.2×10² µA/µm is achieved in Si CS-FETs with $E_{VBM}$=0.1 V.

The above-described device uses only one kind of semiconductor, for example, Si as the channel material without integrating two different semiconductors. In other aspects of the disclosure, both n-type and p-type devices may be realized by changing the doping profiles. The described CS-FET device is highly compatible with modern CMOS technology and introduces a junction composed of p-type Si and metal in the source of conventional n-type devices.

In various aspects of the disclosure, Si FETs with a "cold" source using p-type semiconductor is described and investigated by quantum transport calculations. It is demonstrated that SS as small as 23 mV/decade can be achieved in the CS-FETs. In the proposed device, transport channels are confined between the VBM of p-type Si and CBM of n-type Si, and the off-state current is dramatically suppressed. At the same time, a suitable metal is applied to connect the p-type Si and n-type Si in the source, and carriers can directly transport from source to drain without tunneling at the on-state. As a result, in some examples, $I_{on}$ can be larger than 10³ µA/µm with SS smaller 60 mV/decade at $V_D$=0.5 V. The Si CS-FETs may be used for low power applications. However, the principle of CS-FET is general and applicable to other material systems.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1(a)-4(d) may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1(a)-4(d) may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A metal-oxide-semiconductor field-effect transistor (MOSFET) device, comprising:
   a substrate;
   an oxide layer on the substrate;
   a gate on the oxide layer;
   a source and a drain on the substrate, wherein the source and the drain are doped with a dopant of a first type; and
   a cold source coupled to the source, wherein the cold source comprises a junction between a semiconductor doped with a dopant of a second type, and a material selected from the group consisting of metal and semimetal.

2. The MOSFET device of claim 1, wherein the semiconductor of the cold source comprises a p-type semiconductor that is coupled to the metal to form the junction.

3. The MOSFET device of claim 1, wherein the semiconductor of the cold source comprises a pocket doping region.

4. The MOSFET device of claim 1, wherein the material is selected from the group consisting of aluminum, platinum, palladium, cobalt, ruthenium, silver, graphene, and two-dimensional layered metals.

5. The MOSFET device of claim 1, wherein the dopant of the first type comprises n-type dopant, and the dopant of the second type comprises p-type dopant.

6. The MOSFET device of claim 1, wherein the dopant of the first type comprises p-type dopant, and the dopant of the second type comprises n-type dopant.

7. The MOSFET device of claim 1, wherein the MOSFET device is configured to have a subthreshold swing of less than 60 mV/decade at room temperature.

8. The MOSFET device of claim 7, wherein the MOSFET device is configured to have a subthreshold swing between 23 mV/decade and 60 mV/decade.

9. The MOSFET device of claim 1, wherein the cold source is configured to provide a band gap in the source to suppress a thermal tail.

10. The MOSFET device of claim 9, wherein the cold source is configured to inject cold carriers with a distribution that does not energetically extend into the thermal tail.

11. A method of fabricating a metal-oxide-semiconductor field-effect transistor (MOSFET) device, comprising:
   providing a substrate;
   providing an oxide layer on the substrate;
   forming a gate on the oxide layer;
   forming a source and a drain on the substrate, wherein the source and the drain are doped with a dopant of a first type; and
   forming a cold source coupled to the source, wherein the cold source comprises a junction between a semiconductor doped with a dopant of a second type, and a material selected from the group consisting of metal and semimetal.

12. The method of claim 11, wherein the semiconductor of the cold source comprises a p-type semiconductor that is coupled to the metal to form the junction.

13. The method of claim 11, wherein the semiconductor of the cold source comprises a pocket doping region.

14. The method of claim 11, wherein the material is selected from the group consisting of aluminum, platinum, palladium, cobalt, ruthenium, silver, graphene, and two-dimensional layered metals.

15. The method of claim 11, wherein the dopant of the first type comprises n-type dopant, and the dopant of the second type comprises p-type dopant.

16. The method of claim 11, wherein the dopant of the first type comprises p-type dopant, and the dopant of the second type comprises n-type dopant.

17. The method of claim 11, wherein the MOSFET device is configured to have a subthreshold swing of less than 60 mV/decade at room temperature.

18. The method of claim 17, wherein the MOSFET device is configured to have a subthreshold swing between 23 mV/decade and 60 mV/decade.

19. The method of claim 11, wherein the cold source is configured to provide a band gap in the source to suppress a thermal tail.

20. The method of claim 19, wherein the cold source is configured to inject cold carriers with a distribution that does not energetically extend into the thermal tail.

21. A metal-oxide-semiconductor field-effect transistor (MOSFET) comprising:
   a source region and a drain region of a first conductivity type;
   a body region of a second conductivity type opposite to the first conductivity type, between the source region and the drain region;
   a gate separated by an insulating layer from a channel region of the body region; and
   a cold source coupled to the source region, wherein the cold source is configured to provide a band gap in the source region to suppress a thermal tail.

22. The MOSFET of claim 21, wherein the cold source is configured to inject cold carriers with a distribution that does not energetically extend into the thermal tail.

23. The MOSFET of claim 22, wherein the cold source comprises a junction between a metal and a semiconductor of the second conductivity type.

* * * * *